United States Patent
Hara

[11] Patent Number: 6,136,726
[45] Date of Patent: Oct. 24, 2000

[54] METHOD OF FORMING INTERLAYER FILM BY ALTERING FLUIDITY OF DEPOSITED LAYERS

[75] Inventor: Masaki Hara, Kanagawa, Japan

[73] Assignee: Sony Corporation, Tokyo, Japan

[21] Appl. No.: 09/262,255

[22] Filed: Mar. 4, 1999

Related U.S. Application Data

[62] Division of application No. 08/896,542, Jul. 18, 1997, Pat. No. 5,888,909.

[30] Foreign Application Priority Data

Jul. 19, 1996 [JP] Japan ................................. 8-190641
Aug. 19, 1996 [JP] Japan ................................. 8-216996

[51] Int. Cl.$^7$ ................................................. H01L 21/31
[52] U.S. Cl. ........................... 438/761; 438/778; 438/788
[58] Field of Search ................................. 438/760, 761, 438/778, 787, 788, 784, 758

[56] References Cited

U.S. PATENT DOCUMENTS

| | | |
|---|---|---|
| 5,336,640 | 8/1994 | Sato . |
| 5,424,253 | 6/1995 | Usami et al. . |
| 5,453,406 | 9/1995 | Chen . |
| 5,521,126 | 5/1996 | Okamura et al. . |
| 5,665,643 | 9/1997 | Shin . |
| 5,683,940 | 11/1997 | Yahiro . |
| 5,691,247 | 11/1997 | Lavie et al. . |
| 5,700,720 | 12/1997 | Hashimoto . |
| 5,703,404 | 12/1997 | Matsuura . |
| 5,750,403 | 5/1998 | Inoue et al. . |
| 5,821,162 | 10/1998 | Yamaha et al. . |
| 5,918,146 | 6/1999 | Yamashita . |

FOREIGN PATENT DOCUMENTS

| | | |
|---|---|---|
| 401014925A | 1/1989 | Japan . |
| 404158551A | 6/1992 | Japan . |
| 363073539A | 4/1998 | Japan . |

*Primary Examiner*—Charles Bowers
*Assistant Examiner*—Evan Pert
*Attorney, Agent, or Firm*—Hill & Simpson

[57] ABSTRACT

A method of forming an interlayer film on a substrate with a plurality of patterns formed thereon wherein the interlayer film is deposited on the substrate by a process comprising a plurality of steps in each of which a portion of the film is deposited so as to have different fluidity with the same source material.

In the first aspect of the method, a portion of the interlayer film is at first deposited so as to have relatively reduced fluidity, so that the film is formed with an almost uniform thickness regardless of any pattern width on the substrate. After this, the rest portion of the film is deposited so that it has relatively increased fluidity so as to fill up the trough between the patterns.

In the second aspect of the method, an undercoating film is formed in advance which is then treated to be hydrophobic so that a portion of the interlayer film deposited thereon reduces its fluidity, by which the portion is uniformly deposited regardless of any pattern width. Then, the rest portion of the film is deposited over the above portion of the film with relatively increased fluidity.

3 Claims, 4 Drawing Sheets

METHOD OF FORMING INTERLAYER FILM BY ALTERING FLUIDITY OF DEPOSITED LAYERS

This application is a division of Ser. No. 08/896,542 filed Jul. 18, 1997 now U.S. Pat. No. 5,888,909.

BACKGROUND OF THE INVENTION

This invention relates to a method of forming an interlayer film, particularly to a method suited for forming an interlayer insulating film in manufacturing semiconductor devices.

In manufacturing semiconductor devices, a method is often adopted in which fluid source materials are used to form interlayer insulating films so as to fill up troughs on a substrate surface formed by wiring patterns thereon to assure a high smoothness of the substrate surface. When using the fluid source material for forming the interlayer insulating film, the fluid film, while it is being deposited, flows into the troughs between patterns from the top surfaces of the wiring patterns, resulting in filling the troughs.

When forming such an interlayer insulating film, a single step film deposition process is carried out in the related method to obtain the desired film thickness (for example, see M. Matsuura and M. Hirayama, 1995 Dry Process Symposium, pp. 261–268 (1995)).

Such a method of forming interlayer insulating films, however, causes an undesirable phenomenon that, when the troughs on the substrate surface are formed by a plurality of patterns of differing widths, the thickness of the film formed on each of those patterns varies with dependence on pattern widths (hereinafter, this phenomenon is referred to as poor global smoothness), resulting in differences in level. This is considered to be as follows. When the film is deposited, the fluid film swells on each pattern due to the surface tension. On a wide pattern, the film swells more despite the fluid film flowing into the trough between patterns from the edge of the pattern as the film becomes thicker, so that when the film deposition ends, the film is formed with a thickness as swelled and results in becoming thicker than on a narrower pattern.

If an interlayer insulating film has such poor global smoothness, there occurs problems such as the step coverage of the formed interlayer insulating film becoming poor and a wiring layer or the like becoming thin partially when formed on the interlayer insulating film.

In view of foregoing, it is an object of this invention to provide a method of forming an interlayer film, which can eliminate the above phenomenon that the film formed on each pattern becomes uneven in thickness due to differences in width of those patterns formed on the substrate.

SUMMARY OF THE INVENTION

Above object is achieved by a method of forming an interlayer film in which the interlayer film is formed by a process comprising a plurality of steps in each of which a portion of the film is deposited with the same source material under a condition of providing the portion of film with different fluidity.

In a method of forming an interlayer film according to the first aspect of the present invention, a portion of the interlayer film is at first deposited under a condition of providing the portion of film with relatively reduced fluidity, so that the film is deposited with an almost uniform thickness regardless of any pattern width on the substrate. After this, the rest portion of the film is deposited under a condition of providing the rest portion of the film with relatively increased fluidity so as to fill up the trough between the patterns.

In a method of forming an interlayer film according to the second aspect of the present invention, an undercoating film is formed in advance which affects to reduce fluidity of a portion of the interlayer film to be formed thereon, by which the portion of the interlayer film is deposited with an almost uniform thickness regardless of any pattern width on the substrate. Then, using the same source material, the rest portion of the film is deposited over the above portion of the film under a condition of providing the rest portion of the film with relatively increased fluidity.

DESCRIPTION OF THE PREFERRED EMBODIMENTS

In the following, a method of forming an interlayer film according to the present invention will be explained in detail with reference to some embodiments.

(First Embodiment)

This first embodiment is a method of forming an interlayer film according to the first aspect of the present invention and provides an interlayer film made of an $SiO_2$ film by two steps of film forming processes, which will be explained with reference to FIGS. 1A through 1C.

Figure 1A:
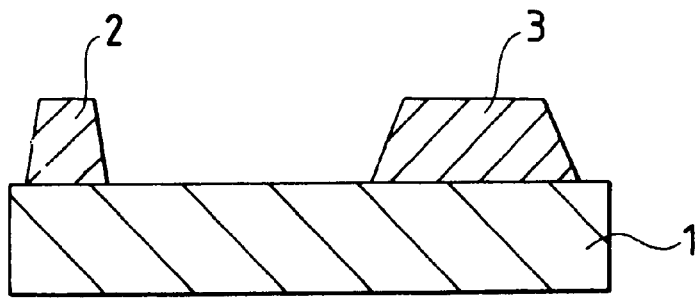
FIG. 1A through FIG. 1C are cross sectional side views of a major part of a semiconductor device for illustrating an embodiment of the present invention including successive processing steps.

FIG. 1A shows a substrate for forming an interlayer film. A substrate 1 is made of a silicon wafer. On this substrate 1 are formed an Al wiring pattern 2 and an Al pad pattern 3 via an oxide film or the like (not illustrated). The Al wiring pattern 2 is formed to be 0.85 $\mu$m in height and 0.4 $\mu$m in width. The Al pad pattern 3 is formed to be 0.85 $\mu$m in height and 100 $\mu$m in width. Between those Al wiring pattern 2 and Al pad pattern 3 is provided an enough space, with which each of those patterns becomes independent of the other. In FIGS. 1A through 1C, the wiring widths of the Al wiring pattern 2 and the Al pad pattern 3 are illustrated with different ratios for convenience.

Figure 1B:
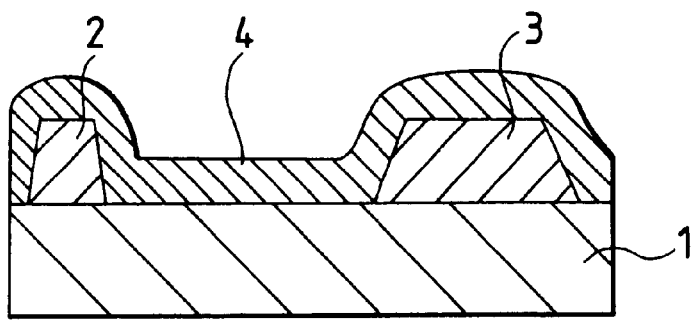

In order to form an interlayer film on the substrate 1, on which are formed the Al wiring pattern 2 and the Al pad pattern 3 of differing widths, to fill up a trough due to the patterns, an $SiO_2$ film 4 is formed in a thickness of 0.4 $\mu$m using a well-known plasma CVD apparatus, and $SiH_4$ and $H_2O_2$ as source materials at a film deposition temperature of 30° C. with the $SiO_2$ film 4 covering the Al wiring pattern 2 and the Al pad pattern 3 as shown in FIG. 1B.

The flow rate of the source material $SiH_4$ was defined to be 120 sccm. As for $H_2O_2$; hydrogen peroxide solution of 60% in concentration was introduced into the reduced pressure CVD apparatus at a flow rate of 0.65 g/min and instantaneously evaporated by a flasher immediately after being introduced to react to $SiH_4$. As a carrier gas, $N_2$ was used at a flow rate of 1000 sccm separately from the above mentioned $SiH_4$ and $H_2O_2$. The reaction pressure was set at 850 m Torr.

Above described $SiH_4$ and $H_2O_2$ used as source materials satisfy a condition for having fluidity when deposited. Specifically, their fluidity is increased at 20° C. or less under the above mentioned flow rate of source material and reaction pressure. Over 30° C., their fluidity is almost lost. On the other hand, their fluidity is increased gradually under 20° C. Especially, under 5° C., their fluidity increases significantly. Such a deposition temperature dependent fluidity change is considered to be due to a reaction mechanism of oxidizing $SiH_4$ into $Si(OH)_4$ by an oxidant $H_2O_2$ and further dehydrating and condensing the resultant $Si(OH)_4$ into $SiO_2$, in which mechanism the process of dehydrating and condensing $Si(OH)_4$ nearly in liquid phase, into $SiO_2$ in solid phase, is accelerated at high temperatures and decelerated at low temperatures.

The $SiO_2$ film 4 formed under such deposition conditions is to be as a portion of the interlayer film in this invention and, because of being formed at 30° C., the film has almost no fluidity when deposited. Consequently, the film becomes almost even in thickness regardless of the widths of the patterns 2 and 3 formed under the film. In this stage, however, the film does not fill up the trough between the patterns 2 and 3 yet.

Figure 1C:
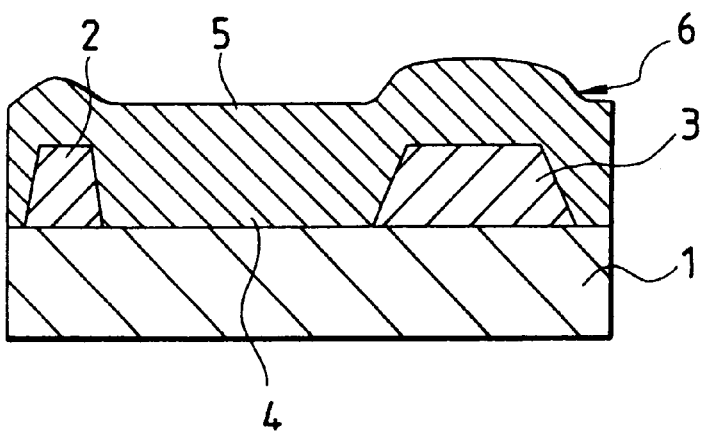

After this, the $SiO_2$ film 5, which is assumed as the rest portion of the interlayer film in this invention, is formed on the above mentioned $SiO_2$ film 4 as shown in FIG. 1C in a thickness of 0.4 μm under the same conditions except for the deposition temperature, which is changed to 0° C. Thus, an interlayer film 6 comprising the $SiO_2$ film 4 together with the above $SiO_2$ film 5 is obtained.

The $SiO_2$ film 5 formed under such deposition conditions has a high fluidity when deposited as mentioned above because of the deposition temperature of 0° C., so that the film can fill up the trough formed on the $SiO_2$ film 4 due to the patterns 2 and 3. Consequently, the interlayer film 5 becomes to provide a satisfactory surface smoothness. In other words, since patterns 2 and 3 are already covered by the $SiO_2$ film 4, the $SiO_2$ film 5 formed on this film comes in contact with the $SiO_2$ film 4 without coming in direct contact with the narrow Al wiring patter 2 and the wide Al pad pattern 3 even on the patterns 2 and 3. Thus, the underside of the $SiO_2$ film 5 is completely occupied with the $SiO_2$ film 4 which provides a uniform wettability. Thus, unlike the related art method, the $SiO_2$ film 5 is not affected by the surface tension on the patterns but is affected only by gravitation when deposited. Consequently, the film 5 can fill up the trough by the fluidity of the film and the surface become smooth.

When an $SiO_2$ film having a thickness of 0.8 μm is formed using $SiH_4$ and $H_2O_2$ as source materials in the state shown in FIG. 1A by a single step deposition process without being divided into two steps at a deposition temperature of 0° C. under the same conditions as mentioned above, the difference in film thickness between the $SiO_2$ films on the Al wiring pattern 2 and the Al pad pattern 3 was 400 nm. In this first embodiment, however, this difference in the film thickness could be reduced down to 150 nm.

Furthermore, with the method in this first embodiment, the difference in film thickness between the $SiO_2$ film on a plurality of the densely formed Al wiring patterns 2 and the $SiO_2$ film on a plurality of the densely formed Al pad patterns 3 could be reduced by 110 nm compared with that with the related art method in which a single step deposition process is carried out.

As explained above, it is confirmed that this first embodiment is very effective for preventing the global smoothness from becoming poor.

In the above embodiment in which the second deposition process is carried out just after the first one, plasma exposure may be carried out onto the $SiO_2$ film 4 just after the first deposition process prior to the formation of the $SiO_2$ film 5. This plasma exposure hardens the plasma-exposed surface of the $SiO_2$ film 4, with which the film 4 loses its fluidity almost completely. Thus the $SiO_2$ film 4 is prevented from flowing slightly to be affected by the difference in widths of patterns 2 and 3 before the second deposition process is carried out.

(Second Embodiment)

This second embodiment is also a method according to the first aspect of the invention and is explained as a method of forming an interlayer film with the plasma CVD method and the reduced pressure CVD method as two steps of deposition processes.

Figure 2:
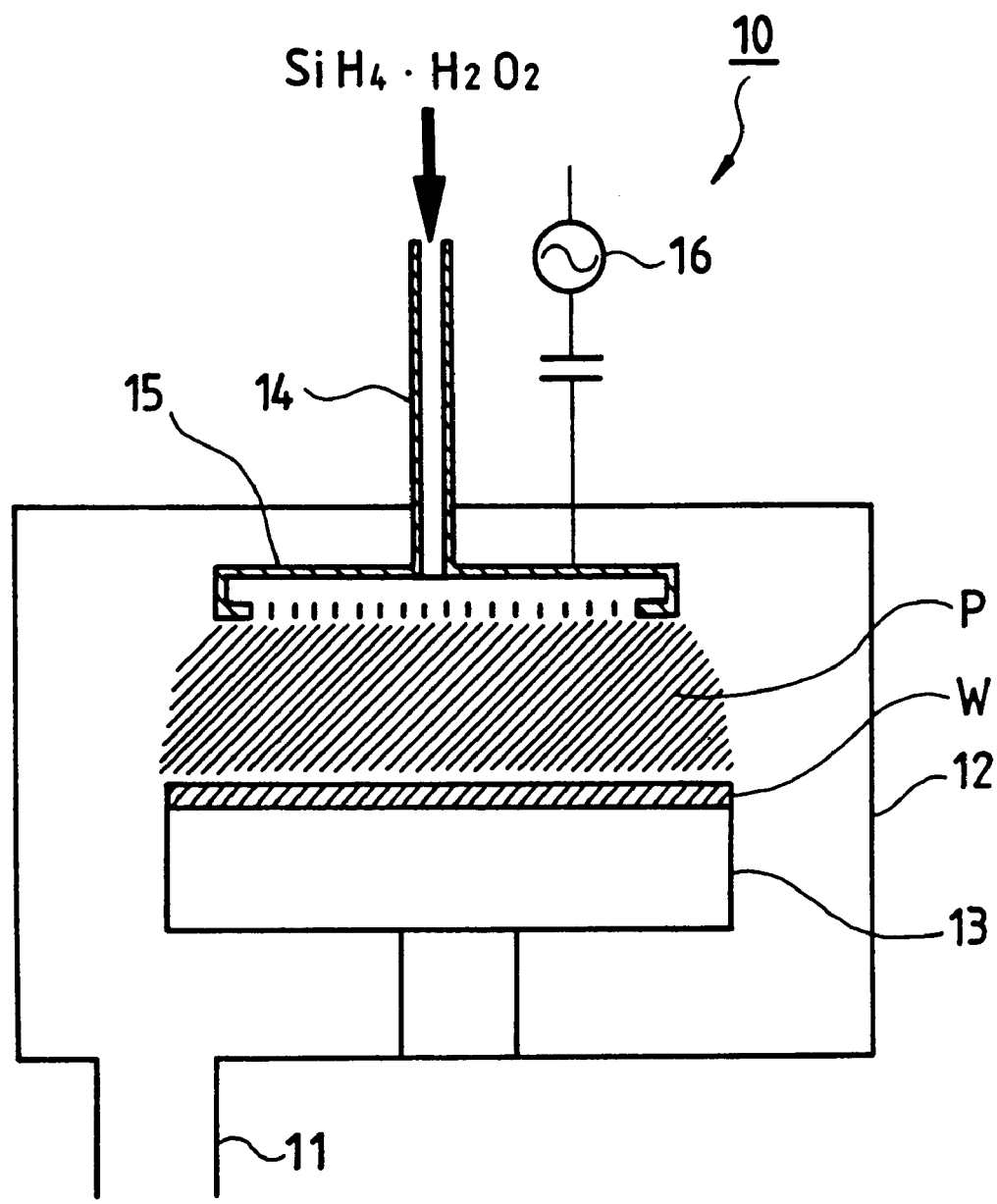
FIG. 2 is a schematic view showing a configuration of a CVD apparatus appropriately used for embodying the present invention.

FIG. 2 shows an apparatus that can carry out both plasma CVD method and reduced pressure CVD method. This CVD apparatus 10 is provided with a wafer stage 13 in vacuum chamber 12 provided with an exhaust pipe 11 connected to a vacuum pump (not illustrated). In the vacuum chamber 12 is provided with a pipe 14 used for introducing source materials specifically $SiH_4$, $H_2O_2$, and a carrier gas ($N_2$) from a source material supply (not illustrated). To this pipe 14 is connected a shower head 15 above the wafer stage 13 in the vacuum chamber 12, with the shower head 15 facing the wafer stage 13. An RF oscillator 16 is connected to this shower head 15 so that plasma is generated between this shower head 15 and the wafer stage 13.

To carry out deposition of a film on a wafer W (substrate 1) on which the Al wiring pattern 2 and the Al pad pattern 3 are formed as shown in FIG. 1A by using such a configuration of the CVD apparatus, at first the wafer W is set on the wafer stage 13 as shown in FIG. 2, and in this state, the vacuum pump is started to evacuate the vacuum chamber 12 to the specified pressure. Then, the temperature of the wafer W is adjusted to 0° C. and an RF power is applied to between the shower head 15 and the wafer stage 13 by the RF oscillator 16 to generate plasma.

The source material is then introduced into plasma P through the shower head 15 from the pipe 14 for reaction to form an $SiO_2$ film as shown in FIG. 1B. (Although the $SiO_2$ film formed in this second embodiment differs from the $SiO_2$ film formed in the first embodiment, a numeral 4 is also assigned to the $SiO_2$ film formed in this second embodiment for convenience of the substrate explanation.)

The flow rates of $SiH_4$ and $H_2O_2$ as source materials, as well as $N_2$ as a carrier gas were set to 120 sccm, 0.65 g/min, and 1000 sccm, respectively. The deposition pressure was set at 850 m Torr.

Since the $SiO_2$ film 4 thus formed under such deposition conditions is assumed as a portion of the interlayer film in this invention and the film is formed with the plasma CVD method, the film does not flow when deposited. Consequently, the film becomes almost even in thickness regardless of the widths of the patterns 2 and 3 formed under the film. In this stage, however, the film cannot fill up the trough between the patterns 2 and 3 yet. Like the case in the first embodiment.

Subsequently, introduction of the material is stopped, and application of RF power by the RF oscillator 16 is stopped to extinguish the plasma in the vacuum chamber 12.

After this, an $SiO_2$ film 5 to be assumed as the rest portion of the interlayer film in this invention as shown in FIG. 1C is formed on the $SiO_2$ film 4 without plasma generation in a thickness of 0.4 μm under the same conditions as those of the preceding deposition. Thus, the interlayer film 6 comprising the $SiO_2$ film 4 and 5 is obtained. (Although the $SiO_2$ film and the interlayer film formed in this second embodiment differ from the $SiO_2$ film 5 and the interlayer film 6 formed in the first embodiment, numerals 5 and 6 are respectively assigned also to the $SiO_2$ film and the interlayer film formed in this second embodiment for convenience.)

Thus formed $SiO_2$ film 5, being deposited under a temperature of 0° C., has high fluidity when deposited, so that it can fill up the trough formed on the surface of the $SiO_2$ film 4 due to the Al wiring pattern 2 and the Al pad pattern 3 like in the first embodiment. Consequently, the interlayer film 5 is formed to have a satisfactory smoothness.

When an $SiO_2$ film having a thickness of 0.8 μm is formed using $SiH_4$ and $H_2O_2$ as source materials in the state shown in FIG. 1A by a single step deposition process without being divided into two steps at a deposition temperature of 0° C. under the same conditions as mentioned above, the difference in film thickness between the $SiO_2$ films on the Al wiring pattern 2 and the Al pad pattern 3 was 400 nm as mentioned above, but in this second embodiment, this difference in film thickness could be reduced down to 170 nm.

Furthermore, with the method in this second embodiment, the difference in film thickness between the $SiO_2$ film on a plurality of the densely formed Al wiring patterns 2 and the $SiO_2$ film formed on a plurality of the densely formed Al pad patterns 3 could be reduced by 100 nm compared with that of the related art method in which a single step deposition process is carried out.

As explained above, it is confirmed that this second embodiment is also very effective for preventing the global smoothness from being poor.

Furthermore, in the first and second embodiments, $SiH_4$ and $H_2O_2$ are used as source materials, but the materials are not limited to them in this invention. For example, instead of $SiH_4$, $Si_2H_6$ and the like may be used, and, instead of $H_2O_2$, an oxidizer dissolved in water such as ozone ($O_3$) dissolved in water or, furthermore, liquid nitrogen and the like may be used.

In the first and second embodiments, two steps deposition process are carried out to form the desired interlayer film 6. The deposition process, however, may be carried out by more than three steps for obtaining the interlayer film 6 by carrying out the first deposition process under a condition basically to reduce the fluidity or prevent the fluidization, and then the subsequent deposition processes under a condition to increase the fluidity.

Furthermore, in the first embodiment, fluidity is adjusted by changing a deposition temperature which is adopted as a deposition condition to reduce or increase the fluidity. However, the fluidity may also be adjusted by changing the deposition pressure, the mixing rate of the source materials, etc.

(Third Embodiment)

This third embodiment explains a method of forming an interlayer film according to the second aspect of the invention and provides the interlayer film made of an $SiO_2$ film on an undercoating film by two steps of film forming processes, which will be explained with reference to FIGS. 3A through 3D.

Figure 3A:
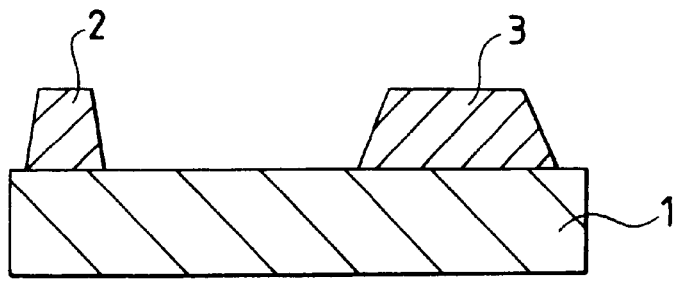
FIG. 3A through FIG. 3D are cross sectional side views of a major part of a semiconductor device for illustrating the third embodiment of the present invention in successive processing steps.

FIG. 3A shows a substrate for forming an interlayer film. A substrate 1 is made of a silicon wafer. On this substrate 1 are formed an Al wiring pattern 2 and an Al pad pattern 3 via an oxide film or the like (not illustrated). The Al wiring pattern 2 is formed to be 0.85 μm in height and 0.4 μm in width. The Al pad pattern 3 is formed to be 0.85 μm in height and 100 μm in width. Between those Al wiring pattern 2 and Al pad pattern 3 is provided an enough space, with which each of those patterns becomes independent of the other. In FIGS. 3A through 3D, the wiring widths of the Al wiring pattern 2 and the Al pad pattern 3 are illustrated with different ratios for convenience.

Figure 3B:
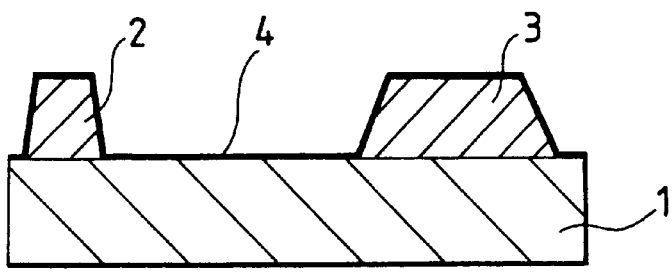

In order to form an interlayer film on the substrate 1, on which are formed the Al wiring patter 2 and the Al pad patter 3 of differing widths, to fill up a trough due to the patterns, an undercoating film is at first formed before forming the interlayer film. In this embodiment, a P-TEOS.$SiO_2$ film 4 (undercoating film) is deposited in a thickness of 0.1 μm with the P-TEOS.$SiO_2$ film 4 covering the Al wiring pattern 2 and the Al pad pattern 3 with a plasma CVD method using a well-known plasma CVD apparatus, and using TEOS (tetraethoxysilane) as a source material at a film deposition temperature of 400° C. as shown in FIG. 3B.

Subsequently, the surface of this P-TEOS.$SiO_2$ film 4 is treated with hydroxylamine ($NH_2OH$), which is a powerful reducing agent. Then, the Si—O bonds of the P-TEOS.$SiO_2$ film 4 are cut by the reduction treatment, so that the surface becomes hydrophobic.

Figure 3C:
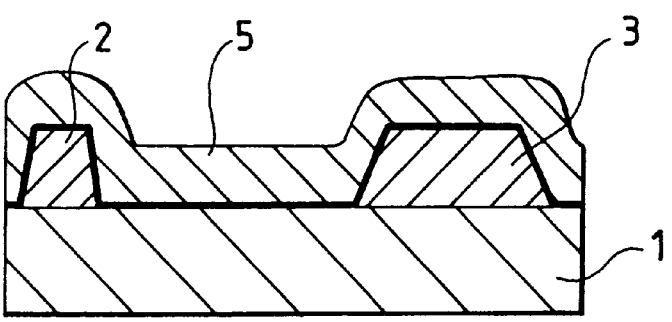

Subsequently, on the hydrophobic surface of the P-TEOS.$SiO_2$ film 4 is formed an $SiO_2$ film 5 (a portion of an interlayer film in this invention) with the $SiO_2$ film 5 covering both of the Al wiring pattern 2 and the Al pad pattern 3 as shown in FIG. 3C. The $SiO_2$ film 5 was deposited at a film-deposition temperature of 0° C. using a well-known reduced pressure CVD apparatus and using $SiH_4$ and $H_2O_2$ as source materials so as to obtain the $SiO_2$ film with a thickness of 0.4 μm.

The flow rate of the source material $SiH_4$ was defined to be 120 sccm. As for $H_2O_2$, hydrogen peroxide solution of 60% in concentration was introduced into the reduced pressure CVD apparatus at a flow rate of 0.65 g/min and instantaneously evaporated by a flasher immediately after being introduced to react with $SiH_4$. As a carrier gas, $N_2$ was used at a flow rate of 1000 sccm separately from the above mentioned $SiH_4$ and $H_2O_2$. The reaction pressure was set at 850 m Torr.

Above described $SiH_4$ and $H_2O_2$ used as source materials satisfy a condition for having fluidity when deposited. Specifically, their fluidity increases at 20° C. or less under the above mentioned flow rate of source material and reaction pressure. Especially, under 5° C., their fluidity increases significantly. Above 20° C., their fluidity decreases and over 30° C., their fluidity is almost lost.

Consequently, in this embodiment, the obtained $Sio_2$ film 5, although it intrinsically exhibits its fluidity when deposited because of being deposited at 0° C., is prevented from exhibiting its fluidity since the hydrophobization treatment is provided in advance on the surface of the P-TEOS.$SiO_2$ film 4 as the undercoating film. This makes the $SiO_2$ film 5 almost even in thickness regardless of the widths of the Al wiring pattern 2 and the Al pad pattern 3. Consequently, in this stage, the $SiO_2$ film 5 formed as a portion of an interlayer film in the invention is prevented from exhibiting its fluidity to have poor smoothness. Thus, the trough formed between the Al wiring pattern 2 and the Al pad pattern 3 is not yet satisfactorily filled up.

Subsequently, the substrate 1 on which the $SiO_2$ film 5 is formed is transferred into another chamber for plasma treatment. In this chamber, the substrate 1 is heated up to 350° C. and, in this state, an oxygen plasma treatment is applied to the $SiO_2$ film 5 for one minute. After such a plasma exposure, the exposed surface of the $SiO_2$ film 5 is hardened and loses its fluidity almost completely to prevent the $SiO_2$ film 5 from such slight flowing that causes the film to be affected by a difference of width between patterns 2 and 3 before the second film deposition is applied. Furthermore, this plasma exposure can also increase the hydrophilic nature of the $SiO_2$ film 5 itself, since the exposure eliminates fluidity of the film as well as reduces the water content in the $SiO_2$ film 5.

Figure 3D:
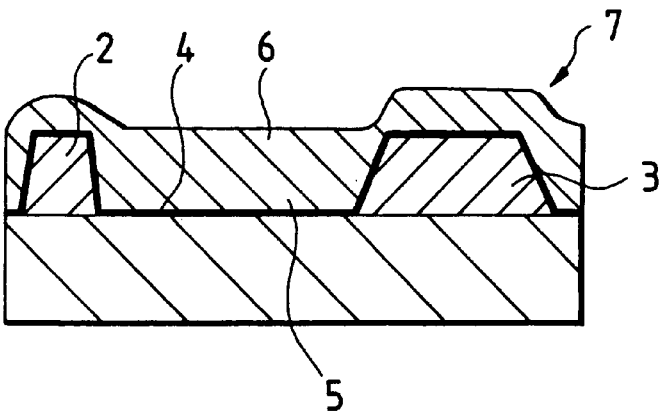

After this, the plasma treated substrate 1 is returned into the original chamber of the reduced pressure CVD apparatus and an $SiO_2$ film 6 assumed as the rest portion of the interlayer film in this invention is formed on the above mentioned $SiO_2$ film 5 as shown in FIG. 3D in a thickness of 0.4 $\mu$m under the same conditions as those of depositing the $SiO_2$ film 5 so as to obtain an interlayer film 7 comprising an $SiO_2$ film together with the above $SiO_2$ film 5.

The $SiO_2$ film 6 thus formed has a high fluidity when deposited as mentioned above because of the deposition temperature of 0° C., so that the film can fill up the trough formed on the surface of the $SiO_2$ film 5 due to the Al wiring patter 2 and the Al pad pattern 3. Consequently, the interlayer film 7 becomes to have a satisfactory smoothness. In other words, since patterns 2 and 3 are already covered by the $SiO_2$ film 5, the $SiO_2$ film 5 to be formed on this film comes in contact with the $SiO_2$ film 5 without coming in contact with the P-TEOS.$SiO_2$ film 4 directly even on the narrow Al wiring pattern 2 and the wide Al pad pattern 3. Thus, the underside of the $SiO_2$ film 6 is completely occupied with the $SiO_2$ film 5 which provides a uniform wettability together with an increased hydrophilic nature due to the plasma exposure. Hence, unlike the related art method, the $SiO_2$ film 6 is not affected by the surface tension on the patterns but is affected only by gravitation when deposited. Consequently, the film 6 can fill up the troughs by the fluidity of the film and the surface becomes smooth.

When an $SiO_2$ film having a thickness of 0.8 $\mu$m is formed with $SiH_4$ and $H_2O_2$ as source materials in the state shown in FIG. 3A by a single step deposition process without being divided into two steps at a deposition temperature of 0° C. under the same conditions as mentioned above, the difference in film thickness between the $SiO_2$ films on the Al wiring pattern 2 and the Al pad pattern 3 was 400 nm. In this third embodiment, however, this difference in film thickness could be reduced down to 160 nm.

Furthermore, with the method in this third embodiment, the difference in film thickness between the $SiO_2$ film (interlayer film 7) on a plurality of the densely formed Al wiring patterns 2 and the $SiO_2$ film (interlayer film 7) on a plurality of the densely formed Al pad patterns 3 could be reduced by 110 nm compared with that with the related art method in which a single step deposition process is carried out.

As explained above, it is confirmed that this third embodiment is very effective for preventing the global smoothness from becoming poor.

In the above embodiment, plasma exposure was carried out after the first film deposition. However, the second film deposition may be carried out without performing the plasma exposure.

(Fourth Embodiment)

This fourth embodiment is also a method of forming an interlayer film according to the second aspect of the invention and provides the interlayer film comprising an $SiO_2$ film on an undercoating film by two steps of film deposition processes, which will be explained with reference to FIGS. 4A through 4E.

Figure 4A:
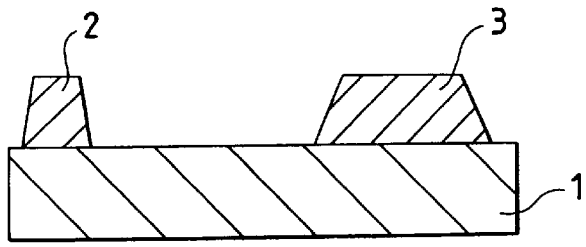
FIG. 4A through FIG. 4E are cross sectional side views of a major part of a semiconductor device for illustrating the fourth embodiment of the present invention in successive processing steps.
Figure 4B:
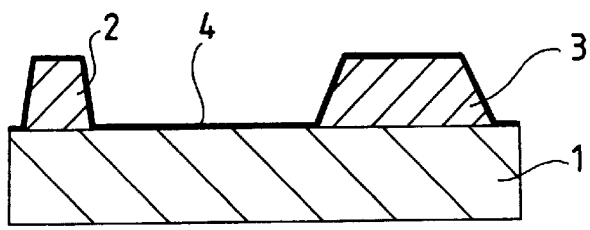

FIG. 4A is a view showing a substrate for forming an interlayer film. Like in FIG. 1A or FIG. 3A, on the substrate 1 made of a silicon wafer are formed an Al wiring pattern 2 and an Al pad pattern 3 via an oxide film or the like (not illustrated). Since those substrate 1, Al wiring pattern 2, and Al pad pattern 3 are the same as those in FIG. 1A or FIG. 3A, detailed explanation for them will be omitted here.

In order to form an interlayer film on the substrate 1, on which are formed an Al wiring pattern 2 and an Al pad pattern 3 of mutually differing widths, to fill up the trough due to the above mentioned patterns, a P-TEOS.$SiO_2$ film 4 (undercoating film) is deposited in a thickness of 0.1 $\mu$m as shown in FIG. 3B before forming the interlayer film like the case in the third embodiment.

Figure 4C:
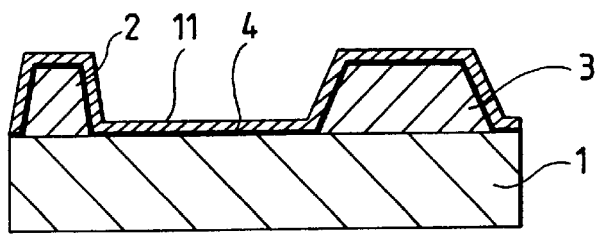

Then, on this P-TEOS.$SiO_2$ film 4 is deposited a hydrogenated amorphous silicon film (a-Si: H film) 11 in a thickness of 10 nm at a deposition temperature of 300° C. with $SiH_4$ as a source material as shown in FIG. 4C. The surface of thus obtained amorphous silicon film 11 exhibits hydrophobic nature when deposited.

Figure 4D:
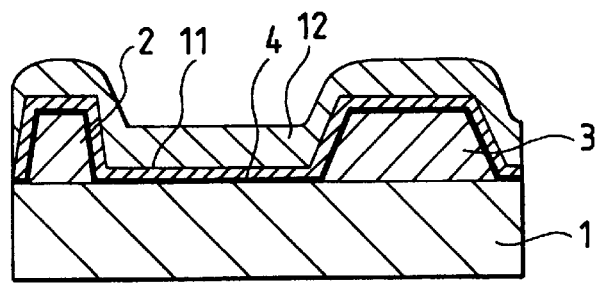

Subsequently, on the surface of this amorphous silicon film 11 is deposited an $SiO_2$ film (a portion of an interlayer film 12 in the invention) in a thickness of 0.4 $\mu$m, covering the Al wiring pattern 2 and the Al pad pattern 3 as shown in FIG. 4D. The deposition of this $SiO_2$ film 12 is carried out under the same conditions as those of the $SiO_2$ film 5 in the first embodiment.

Thus obtained $SiO_2$ film 12 is prevented from exhibiting its fluidity since the surface of the amorphous silicon film 11 deposited on the P-TEOS.$SiO_2$ film 4 as an undercoating film in advance exhibits hydrophobic nature. This makes the $SiO_2$ film 12 almost even in thickness regardless of the widths of the Al wiring pattern 2 and the Al pad pattern 3. Consequently, the $SiO_2$ film 12 formed as a portion of an interlayer film in this invention is prevented from exhibiting its fluidity like the case in the third embodiment to have poor smoothness. Thus, the trough formed between the Al wiring pattern 2 and the Al pad pattern 3 is not yet satisfactorily filled up in this stage.

After this, like in the third embodiment, the substrate 1 on which the $SiO_2$ film 12 is formed is transferred into another chamber for plasma treatment. In the chamber the substrate 1 is heated up to 350° C. and, in this state, an oxigen plasma treatment is applied to the $SiO_2$ film 12 for one minute.

Figure 4E:
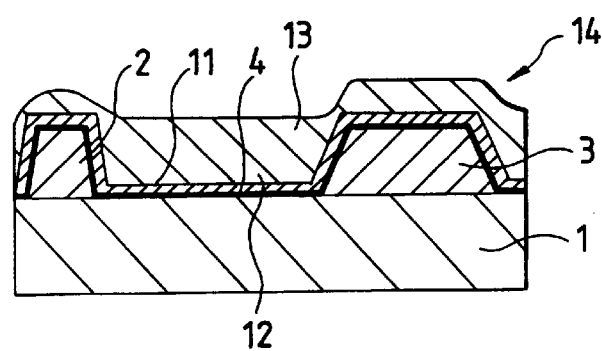

After this, the plasma treated substrate 1 is returned into the original chamber of the reduced pressure CVD apparatus and an $SiO_2$ film 13 assumed as the rest portion of the interlayer film in this invention is formed on the above mentioned $SiO_2$ film 12 as shown in FIG. 4E under the same conditions as those of depositing the $SiO_2$ film 12 in a thickness of 0.4 $\mu$m to obtain an interlayer film 14 comprising the $SiO_2$ film together with the above $SiO_2$ film 12.

Thus formed $SiO_2$ film 13, being deposited under a temperature of 0° C. so as to have high fluidity when deposited, can fill up the trough formed on the surface of the $SiO_2$ film 12 due to the Al wiring pattern 2 and the Al pad pattern 3 like the case in the third embodiment. Consequently, the interlayer film 14 is formed to have a satisfactory smoothness. In other words, since patterns 2 and 3 are already covered by the $SiO_2$ film 12, the $SiO_2$ film 13 to be formed on the film 12 comes in contact with the $SiO_2$ film 12 without coming in contact with the amorphous silicon film 11 directly even on the narrow Al wiring pattern 2 and the wide Al pad pattern 3. Thus, the $SiO_2$ film 13 is completely occupied with the $SiO_2$ film 12 thereunder which provides a uniform wettability together with an increased hydrophilic nature due to the plasma exposure. Consequently, unlike the prior art method, the film 13 is not affected by the surface tension on the patterns when deposited and accordingly the film 13 can be filled in the troughs due to its fluidity to be smoothed like the case in the first embodiment.

When an $SiO_2$ film having a thickness of 0.8 μm is formed using $SiH_4$ and $H_2O_2$ as source materials in the state shown in FIG. 4A by a single step deposition process without being divided into two steps at a deposition temperature of 0° C. under the same conditions as mentioned above, the difference in film thickness between the $SiO_2$ films on the Al wiring pattern 2 and the Al pad patter 3 was 400 nm as mentioned above, but in this third embodiment, this difference in film thickness could be reduced down to 160 nm.

Furthermore, with the method in the third embodiment, the difference in film thickness between the $SiO_2$ film (interlayer film 14) on a plurality of the densely formed Al wiring patterns 2 and the $SiO_2$ film (interlayer film 14) on a plurality of the densely formed Al pad patterns 3 could be reduced by 110 nm compared with that with the related art method in which a single step deposition process is carried out.

As explained above, it is confirmed that this second embodiment is also very effective for preventing the global smoothness from being poor.

In the above embodiment, plasma exposure was carried out after the first film deposition, but the second film deposition may be carried out without performing the plasma exposure.

Furthermore, instead of the amorphous silicon film 11, a similarly hydrophobic polysilicon film may be deposited on the P-TEOS.$SiO_2$ film 4.

(Fifth Embodiment)

This fifth embodiment is also a method of forming an interlayer film according to the second aspect of the invention and provides the interlayer film comprising an $SiO_2$ film on an undercoating film by two steps film deposition process. It is different from the third embodiment shown in FIGS. 3A through 3D in that the $SiO_2$ film 5 is formed after the formation of the P-TEOS.$SiO_2$ film 4 as a hydrophobic undercoating film with the hydrophobic nature of the formed P-TEOS.$SiO_2$ film 4 being retained, instead of carrying out the reduction treatment for the film 4.

In other words, in this embodiment, after the P-TEOS.$SiO_2$ film 4 is formed as shown in FIG. 3B, the substrate 1 is transferred into a chamber of the reduced pressure CVD apparatus with the vacuum pressure in depositing the P-TEOS.$SiO_2$ film 4 being maintained so that the hydrophobic nature of the P-TEOS.$SiO_2$ film 4 is retained. Then, the P-TEOS.$SiO_2$ film 4, which becomes hydrophobic due to many dangling bonds (unjoined bonds) existing on the surface immediately after the deposition, can retain its hydrophobic nature because the substrate 1 is held in vacuum while being transferred into a chamber of the reduced pressure CVD apparatus.

Consequently, the $SiO_2$ film 5, being formed under the same conditions as those in the case shown in FIG. 3C with the P-TEOS.$SiO_2$ film 4 thus retaining its hydrophobic property, is prevented from exhibiting its fluidity and accordingly the film thickness becomes almost even regardless of the widths of the Al wiring pattern 2 and the Al pad pattern 3. Thus, like the case in the third embodiment, the $SiO_2$ film 5 has poor smoothness and accordingly does not fill up the trough between the Al wiring patter 2 and the Al pad pattern 3 yet in this stage.

Subsequently, the surface of the $SiO_2$ film 5 is exposed to a plasma like in the first embodiment, and then the $SiO_2$ film 6 is formed in a thickness of 0.4 μm under the same film deposition conditions as those in the first embodiment to obtain an interlayer film 7.

Thus formed $SiO_2$ film 6, being deposited at a temperature of 0° C. so as to increase its fluidity, can fill up the trough formed between the Al wiring pattern 2 and the Al pad pattern 3 on the surface of the $SiO_2$ film 5 like the case in the third embodiment. Consequently, the interlayer film 7 is formed to have a satisfactory smoothness. In other words, since patterns 2 and 3 are already covered by the $SiO_2$ film 5, the $SiO_2$ film 6 to be formed on the film 5 comes in contact with the $SiO_2$ film 5 without coming in contact with the P-TEOS.$SiO_2$ film 4 directly even on the narrow Al wiring pattern 2 and the wide Al pad pattern 3. Thus, the underside of the $SiO_2$ film 6 is completely occupied with the $SiO_2$ film 5 which provides a uniform wettability together with an increased hydrophilic nature due to the plasma exposure. Therefore, unlike the related art method, the film 6 is not affected by the surface tension on the patterns when deposited and, like the case in the third embodiment, the film 6 can fill up the troughs due to its fluidity to smooth the surface.

When an $SiO_2$ film having a thickness of 0.8 μm is formed using $SiH_4$ and $H_2O_2$ as source materials in the state shown in FIG. 3A by a single step deposition process without being divided into two steps at a deposition temperature of 0° C. under the same conditions as mentioned above, the difference in film thickness between the $SiO_2$ films on the Al wiring pattern 2 and the Al pad pattern 3 was 400 nm as mentioned above. In this third embodiment, however, this difference in film thickness could be reduced down to 180 nm.

Furthermore, with the method in this fifth embodiment, the difference in film thickness between the $SiO_2$ film (interlayer film 7) on a plurality of the densely formed Al wiring patterns 2 and the $SiO_2$ film (interlayer film 7) formed on a plurality of the densely formed Al pad patterns 3 could be reduced by 120 nm compared with that with the related art method in which a single step deposition process is carried out.

As explained above, it is confirmed that this fifth embodiment is also very effective for preventing the global smoothness from becoming poor.

In the above embodiment, plasma exposure was carried out after the first film deposition, but the second film deposition may be carried out without performing the plasma exposure.

Furthermore, in the third, fourth, and fifth embodiments, $SiH_4$ and $H_2O_2$ are used as source materials, but the materials are not limited to them in this invention. For example, instead of $SiH_4$, $Si_2H_6$ and the like may be used, and, instead of $H_2O_2$, an oxidizer dissolved in water such as ozone ($O_3$) dissolved in water or, furthermore, oxygen and the like may be used.

As explained above, in the method of forming the interlayer film according to the first aspect of the present invention, since the first film deposition is carried out under a condition to reduce the fluidity or prevent fluidization, the obtained film (a portion of an interlayer film) becomes almost even in thickness regardless of the widths of patterns. Furthermore, since the rest portion of the interlayer film is formed on this film under a condition to increase the fluidity when deposited, this rest portion fills up the trough between patterns. Consequently, the interlayer film comprising the above mentioned portion of the interlayer film and this rest portion becomes to have satisfactory smoothness even on patterns of differing widths.

In the method of forming the interlayer film according to the second aspect of the present invention, an undercoating film is formed on the surface of a substrate, then a portion of an interlayer film is formed after the undercoating film is reduction treated so as to become hydrophobic or after a polysilicon film or an amorphous silicon film is deposited on the undercoating film, or with the hydrophobic nature of the undercoating film being retained, so that the obtained film (a portion of the interlayer film) becomes almost even in thickness regardless of the widths of wiring patterns. And, since the rest portion of the interlayer film is formed on this film, the rest portion fills up the trough between wiring patterns, with which the interlayer film comprising the above mentioned portion and this rest portion becomes to have satisfactory smoothness even on wiring patterns of differing widths.

According to the present invention, therefore, with such a simple process as to combine a plurality of film deposition steps, occurrence of a phenomenon that a thickness of a film deposited on a pattern differs with dependence on a pattern width on the substrate (poor global smoothness) can be suppressed compared with a case in which a single layer film is deposited by the same thickness. This can prevent problems such as the step coverage of the formed interlayer film becoming poor and a wiring layer etc. becoming thin partially when formed on the interlayer film.

What is claimed is:

1. A method of forming an interlayer film comprising the steps of:

forming a first interlayer film on a surface of a substrate using a set of source materials under a deposition condition of providing said first interlayer film with relatively reduced fluidity when deposited, said surface of said substrate having a plurality of patterns of mutually differing widths formed thereon and said first interlayer film being deposited with a plasma CVD method so as to cover said patterns; and forming a second interlayer film on said first interlayer film using said set of source materials with a reduced pressure CVD method using the same source material as that of said first interlayer film under a deposition condition of providing said second interlayer film with relatively increased fluidity when deposited.

2. A method of forming an interlayer film as defined in claim 1, wherein said first and second interlayer films are formed by using $SiH_4$ and $H_2O_2$ as the source materials.

3. A method of forming an interlayer film as defined in claim 1, wherein said first and second interlayer films are formed by using $SiH_4$, and $O_3$ dissolved in water as the source materials.

* * * * *